United States Patent [19]

Ziegler et al.

[11] 4,203,280
[45] May 20, 1980

[54] TOUCH SENSITIVE DEVICE FOR A TIMEPIECE

[75] Inventors: Jacques Ziegler, Bienne; Ali Schneiter, Neuchatel; Rémy Grandjean, Fontainemelon, all of Switzerland

[73] Assignee: Ebauches, S.A., Switzerland

[21] Appl. No.: 962,780

[22] Filed: Nov. 21, 1978

[30] Foreign Application Priority Data

Nov. 22, 1977 [CH] Switzerland ............... 14371/77

[51] Int. Cl.² .................. G04B 37/00; G08C 1/00
[52] U.S. Cl. ......................... 368/187; 368/321; 200/DIG. 1; 340/365 C
[58] Field of Search .............. 58/4 A, 23 R, 50 R, 58/85.5, 90 R, 90 B; 200/DIG. 1, 159 R, 302, 336, 340; 235/145 R; 340/365 C

[56] References Cited

U.S. PATENT DOCUMENTS

| | | | |
|---|---|---|---|
| 3,871,170 | 3/1975 | Bergey | 58/50 R |
| 3,911,664 | 10/1975 | Haber | 58/50 R |
| 3,946,182 | 3/1976 | Holder | 58/50 R |
| 4,090,353 | 5/1978 | Maeda et al. | 58/50 R |

FOREIGN PATENT DOCUMENTS 665294 1/1952 United Kingdom .

Primary Examiner—Edith S. Jackmon
Attorney, Agent, or Firm—Silverman, Cass & Singer, Ltd.

[57] ABSTRACT

A touch sensitive device for controlling a function of a timepiece is formed with a condenser having a capacity independent of the area of the device touched. A conductive stem is fixed in a timepiece case and is electrically insulated from the case by a mounting member. A head is fixed on an end of the stem adjacent the outside of the timepiece to form one of the condenser electrodes. A thin layer of insulating material covers the outside of the head and forms the condenser dielectric. A layer of conductive material is fixed on a side of the dielectric material opposite the head and forms the second condenser electrode. When the second electrode is energized by the touch of the user, the entire second electrode is energized independent of the area touched by the user, giving the condenser a capacity independent of the area of the second electrode touched.

6 Claims, 6 Drawing Figures

TOUCH SENSITIVE DEVICE FOR A TIMEPIECE

The present invention relates to an operating device, comprising a stationary key, of an electronic control circuit of the functions of an electronic timepiece.

Devices are known which are intended to replace the push button switches generally used for controlling the several functions of an electronic watch such as resetting to zero, putting the watch into service and the use of a chronograph function or still others. These known devices are constituted by one or several transparent electrodes arranged on the inner face of the glass or crystal of the watch. The electrodes comprise a circuit arranged to use the signals produced when the user places his finger on the crystal opposite these electrodes.

Such devices exhibit the drawback that, when the user places his finger on the crystal of the watch for controlling one or the other of these functions, he at the same time masks the dial or the display, which prevents him from conveniently watching the process of the operation. The connection of the electrodes deposited under the crystal with the circuit of the watch gives rise to difficult problems too.

For removing these drawbacks, it has been suggested, especially in the U.S. Pat. No. 3,992,873, to arrange a control key in the case band of the watch. The key is constituted by a cylindrical insulating mounting member arranged in the case band and by a metallic stem traversing the insulating mounting member. The outer end of the stem is flush with the outer surface of the mounting member, while the inner end of the stem is connected to the control circuit of the watch. A pressure exerted by the user's finger on the key establishes, between the stem and the case band, a resistive connection which modifies the state of the control circuit.

A key of this type has however a non-negligible sensitivity to outer or external factors such as the humidity or dampness of the user's finger or the presence of dust or of impurities.

The purpose of the present invention is to profit from the advantages of the previous solutions and to remove their drawbacks by supplying an operating device having a stationary key operating capacitively. Such a key consequently is not sensitive to external factors, and is mounted in the case band of the watch which consequently prevents or keeps the user from masking the dial.

More precisely, the invention relates to an operating device, having a stationary key, of the electronic control circuit of the functions of an electronic timepiece. The operating device comprises a mounting member made of electrically insulating material traversing an element of the casing of the timepiece and a conductive stem traversing the mounting member. The device is characterized by the fact that the stem is provided with a head at its outer end, the head being covered outwardly with a thin layer of electrically insulating material.

The drawing shows, by way of example, several embodiments of the invention.

Figure 1:
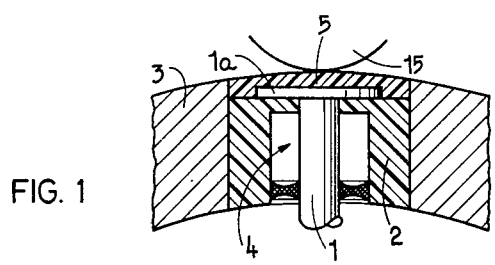
FIG. 1 is a sectional view of a portion of a watch representing a first embodiment of the operating device.

The operating device illustrated in FIG. 1 comprises a stationary key constituted by head 1a of a metallic stem 1 located in a mounting member 2 made of insulating material, forced in a case band 3 of a casing of a watch. This head 1a constitutes one of the plates of a variable condenser the role and the function of which will be indicated hereinafter. The stem 1 is connected, at least indirectly, and in a way not shown in the drawing to the input of a circuit referred to hereinafter.

An annular free space 4 surrounds the portion of the stem 1 situated inside the mounting member 2, along almost the whole length of stem 1. The head 1a is especially thin, so as to reduce as much as possible the capacity of a parasitic condenser which will be mentioned in relation to FIG. 2. This head 1a is covered with a cap 5 made of a thin electrically insulating material. The thickness of the cap 5 can be, for instance, between some microns and some tenths of a millimeter.

Figure 2:
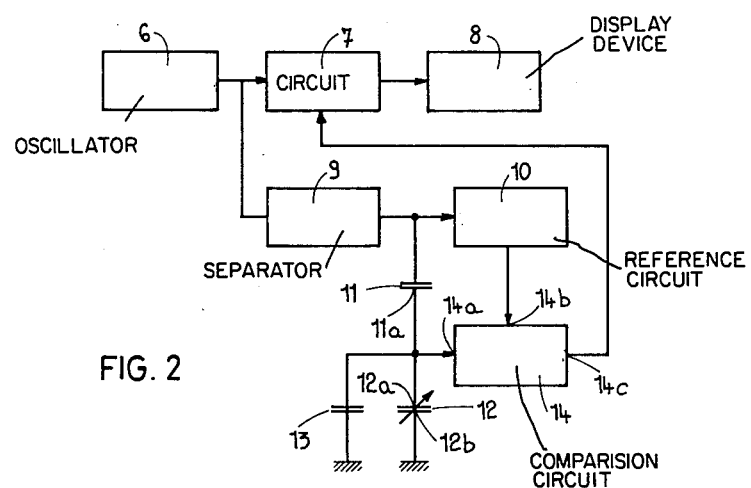
FIG. 2 shows the block-diagram of a watch comprising the equivalent circuit of this first embodiment and the associated circuits.

FIG. 2 shows the block-diagram of a watch provided with the operating device of FIG. 1. It shows an oscillator 6 used, in a conventional way, as a time base of the watch. Oscillator 6 delivers a signal having a frequency of, for instance 32 kHz to an electronic circuit 7 comprising frequency dividers to and all the annexed circuits of the watch, such as the reset to zero circuit, a possible alarm circuit, circuit of a circuit of chronograph circuit, or others. This circuit 7 delivers, especially, the control signals for the display device 8 of the time indications of the watch.

The output of the oscillator 6 also is connected, through a separating stage or separator 9 which can be realized merely by two inverters in series, to the input of a reference circuit 10 adapted to deliver at its output a reference signal.

A capacitive divider constituted by a stationary or fixed condenser 11 and a variable condenser 12, mounted in series, is connected between the output of the separator 9 and one of the poles of an electric energy source of the watch. The source is not represented in the drawing but feeds all the circuits of the watch. This same pole is also connected to the ground of the watch. The first electrode, 12a, of the condenser 12 is constituted by the head 1a of the stem 1 shown in FIG. 1. A condenser 13, connected in parallel with the condenser 12, represents a parasitic condenser constituted by the stem 1 and the lateral surface of its head 1a on the one hand, and the case band 3 of the watch on the other hand.

The electrodes 11a and 12a of the condensers 11 and 12, which are connected to each other, are also connected to the input 14a of a comparison circuit 14 which receives on a second input 14b the reference signal delivered by the reference circuit 10. This comparator or comparison circuit 14 delivers to its output 14c a signal which takes different logic states depending whether the signal applied to its input 14a has an amplitude greater or smaller than that of the reference signal applied to its input 14b. This logic signal is applied to the electronic circuit 7 for controlling, in a known way, the several circuits of the watch.

The second electrode, 12b, of the condenser 12 is constituted by any object electrically connected to the ground of the watch. Normally, as nothing lies opposite the head 1a, one can consider that the capacity of this condenser is zero.

It may be useful to recall, in this respect, that the capacity of a condenser is proportional to the area of its electrodes and inversely proportional to the distance which separates them. In the present case, where no object lies opposite the head 1a, this distance is practically infinite so that the capacity is zero. In the case of the parasitic condenser 13, it is the surface of the electrodes, determined mainly by the lateral surface of the head 1a, which is very small, which renders the capacity of the condenser 13 very small, even negligible.

Always in the case where no object lies opposite the head 1a, the amplitude of the signal applied to the input 14a of the comparator or comparison circuit 14 is therefore practically equal to the amplitude of the signal delivered by the separator 9. This amplitude is higher than that of the reference signal, and the signal delivered by the output 14c of the comparator takes a first logic state, for instance the state 0.

If the user, the body of whom is connected to the ground of the watch by the intermediary of the bottom of the casing, puts his finger, designated by 15 in FIG. 1, on the cap 5, the capacity of the condenser 12 is greatly increased. The distance separating its electrodes becomes, indeed, only the thickness of the cap 5, which is very small. The amplitude of the signal applied to the input 14a of the comparison circuit 14 is consequently reduced; it becomes equal, at least in a first approximation, to the amplitude of the signal delivered by the separator 9 multiplied by the ratio (C11/C11+C12) where C11 and C12 are respectively the capacities of the condensers 11 and 12. This value is lower than the amplitude of the reference signal, and the comparison circuit 14 then delivers a signal having the logic state 1. This signal is used by the electronic circuit 7 for controlling the several functions of the watch.

Figure 3A:
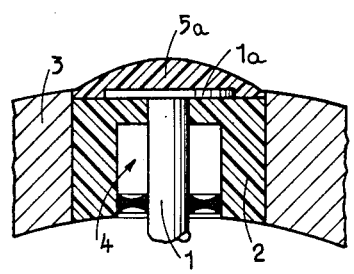
FIGS. 3a and 3b show modifications of the embodiment of FIG. 1.
Figure 3B:
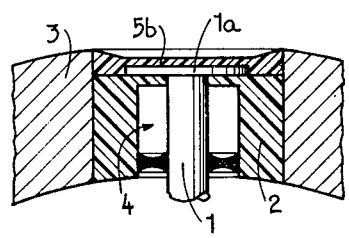

FIGS. 3a and 3b represent two embodiments of the device very similar to that of FIG. 1, with the being that the caps 5a, and 5b, and respectively form, with respect to the surface of the case band 3, a protrusion and a recess. These embodiments give a certain tactile sensation to the user when he puts his finger on the stationary key.

Figure 4:
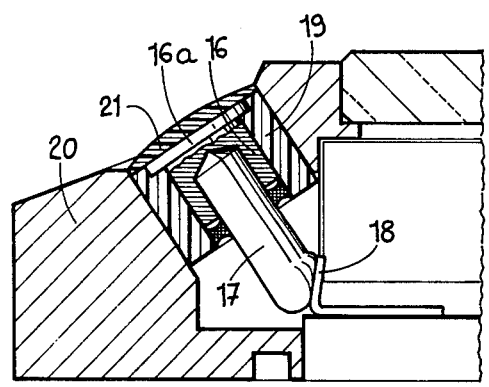
FIG. 4 is a sectional view of a portion of a watch representing a second embodiment of the operating device.

In the embodiment of FIG. 4, the operating device comprises a metallic sleeve 16 provided with a head 16a inside of which is forced a conductive stem 17. Conductive stem 17 is made of for instance a conductive elastomer, and is in contact with a metallic blade 18 which ensures a connection with the circuit of the watch.

The metallic sleeve 16 is located in a mounting member 19 which is made of insulating material and which is itself forced in the case band 20 of the casing of the watch. An insulating cap 21 covers the head 16a.

The sleeve 16, its head 16a and the stem 17 play the same part as the stem 1 and the head 1a of the embodiment of FIG. 1. The mounting member 19 and the cap 21 correspond to the mounting member 2 and the cap 5 of the embodiment of FIG. 1.

The circuit associated with the embodiments of FIGS. 3a, 3b and 4 is exactly the same as that represented in FIG. 2.

Figure 5:
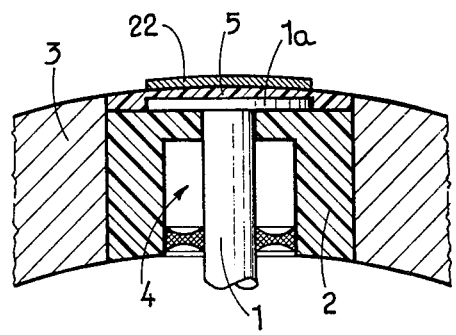
FIG. 5 is a sectional view of a portion of a watch representing a third embodiment of the operating device.

FIG. 5 represents an embodiment similar to that of FIG. 1 with the difference that the insulating cap 5 is covered, outwardly, with a conductive layer 22, deposited for instance by metallization. This layer has no contact with the case band 3, so that the value of the capacity produced by the presence of the finger of the user does not depend on the area of the zone of contact between the user's finger and the cap.

To be complete, one can mention that there also exists, in parallel with the condenser 12, a parasitic resistance, constituted by the combination of the resistances of the mounting member 2 or 19 and the cap 5 or 21. But the value of this parasitic resistance is so high that its role is absolutely negligible.

What we claim is:

1. A touch sensitive device for controlling at least one function of an electronic timepiece, the timepiece including a casing, the device comprising:

an element of the timepiece casing, the element having an opening therethrough from the outside to the inside of the timepiece;

mounting member means formed of electrically insulating material and traversing the opening in the casing element for providing a passageway therein electrically insulated from the casing element;

a stem formed of electrically conductive material traversing the passageway in the mounting member means and being fixed in a position therein, the stem including a head on an end of the stem with a surface adjacent an outside surface of the timepiece to form one electrode of a condenser;

a thin layer of an electrically insulating material covering the outside surface of the stem head to form a dielectric of the condenser;

conductive layer means fixed on a side of the dielectric opposite the outside surface of the one electrode and spaced from the casing element for forming a second electrode of the condenser such that the capacity of the condenser is independent of the area of the stem head covered by a contact to control a function of the timepiece.

2. A touch sensitive device as claimed in claim 1 in which the stem is supported by the mounting member means in the passageway at least adjacent the stem head, and in which the mounting member means include an annular gap between the mounting member means and the stem along at least a portion of the length of the stem.

3. A touch sensitive device as claimed in claim 1 in which the passageway traverses the mounting member means from the outside to the inside of the timepiece.

4. A touch sensitive device as claimed in claim 3 in which the stem head covers at least part of an outside surface of the mounting member means.

5. A touch sensitive device as claimed in claim 1 in which the dielectric is separate from the mounting member means.

6. A touch sensitive device as claimed in claim 1 in which the conductive layer means covers at least the outside area of the stem head.

* * * * *